United States Patent
Lee et al.

(10) Patent No.: US 12,294,388 B2
(45) Date of Patent: May 6, 2025

(54) CONTINUOUS-TIME DELTA-SIGMA ANALOG-TO-DIGITAL CONVERTER AND OPERATION METHOD THEREOF

(71) Applicant: Daegu Gyeongbuk Institute of Science and Technology, Daegu (KR)

(72) Inventors: Jung Hyup Lee, Daegu (KR); Ji Woong Choi, Seoul (KR); Se Hwan Lee, Chilgok-gun (KR)

(73) Assignee: DAEGU GYEONGBUK INSTITUTE OF SCIENCE AND TECHNOLOGY, Daegu (KR)

(*) Notice: Subject to any disclaimer, the term of this patent is extended or adjusted under 35 U.S.C. 154(b) by 173 days.

(21) Appl. No.: 18/168,882

(22) Filed: Feb. 14, 2023

(65) Prior Publication Data
US 2023/0261671 A1    Aug. 17, 2023

(30) Foreign Application Priority Data
Feb. 15, 2022 (KR) .................. 10-2022-0019670
Dec. 16, 2022 (KR) .................. 10-2022-0176611

(51) Int. Cl.
H03M 1/00       (2006.01)
H03M 3/00       (2006.01)

(52) U.S. Cl.
CPC .................. *H03M 3/484* (2013.01)

(58) Field of Classification Search
CPC ........ H03M 3/484; H03M 1/60; H03M 3/464; H03M 3/422
USPC .................................. 341/126, 155, 143
See application file for complete search history.

(56) References Cited

U.S. PATENT DOCUMENTS

| | | | | |
|---|---|---|---|---|
| 9,397,692 B1* | 7/2016 | Zanbaghi | ............... | H03M 3/438 |
| 10,491,237 B1* | 11/2019 | Kim | ...................... | H03M 3/464 |
| 2007/0152815 A1* | 7/2007 | Meyers | .................... | H04Q 9/00 |
| | | | | 340/539.22 |
| 2007/0152865 A1 | 7/2007 | Melanson | | |
| 2012/0194365 A1* | 8/2012 | Niwa | .................... | H03M 3/424 |
| | | | | 341/110 |

(Continued)

FOREIGN PATENT DOCUMENTS

KR        10-1982209 B1       5/2019

OTHER PUBLICATIONS

Extended European Search Report dated Jul. 14, 2023 in European Application No. 23156875.9.

(Continued)

*Primary Examiner* — Jean B Jeanglaude
(74) *Attorney, Agent, or Firm* — Sughrue Mion, PLLC (57) ABSTRACT

Disclosed are a continuous-time delta-sigma analog-to-digital converter and an operation method thereof. More particularly, a continuous-time delta-sigma analog-to-digital converter, including: a linear integrator configured to generate a first output signal corresponding to a preset input voltage based on an operation of a linear Gm circuit that receives the preset input voltage; and a quantizer configured to generate a second output signal corresponding to the first output signal based on an operation of a body-driven VCO that receives the first output signal and to generate a digital output code corresponding to the second output signal based on an operation of a Frequency to Digital Converter (FDC) that receives the second output signal is disclosed.

10 Claims, 11 Drawing Sheets

(56) References Cited

U.S. PATENT DOCUMENTS

2021/0203287 A1* 7/2021 Kinyua .................. H03M 1/60

OTHER PUBLICATIONS

Pan et al., "A Linearization Technique for Ring VCO Exploiting Bulk-Modulation", IEEE International Midwest Symposium on Circuits and Systems (MWSCAS), 2021, pp. 737-740 (4 pages total).
Straayer et al., "A 12-Bit, 10-MHz Bandwidth, Continuous-Time ΣΔ ADC With a 5-Bit, 950-MS/s VCO-Based Quantizer", IEEE Journal of Solid-State Circuits, 2008, vol. 43, No. 4, pp. 805-814 (10 pages total).
Lee et al., "A 6.5$_\mu$W 10KHz-BW 80.4dB-SNDR Continuous-Time ΔΣ Modulator with $G_m$-Input and 300mV$_{pp}$ Linear Input Range for Closed-Loop Neural Recording", IEEE International Solid-State Circuits Conference, 2020, pp. 410-412 (3 pages total).
Corentin Pochet, et al., "28.4 A 400mVpp 92.3 dB-SNDR 1kHz-BW 2nd-Order VCO-Based ExG-to-Digital Front-End Using a Multiphase Gated-Inverted Ring-Oscillator Quantizer", ISSCC 2021/ Session 28 / Biomedical Systems / 28.4, Dig. Tech. Papers, Feb. 2021, pp. 392-394.
Saeideh Kabirpour et al., "A highly linear current-starved VCO based on a linearized current control mechanism", Integration, Accepted Manuscript, 2019, pp. 1-8 (10 pages total).
Office Action of Korean Patent Application No. 10-2022-0176611 issued from Korean Intellectual Property Office dated Mar. 4, 2024.

\* cited by examiner

CONTINUOUS-TIME DELTA-SIGMA ANALOG-TO-DIGITAL CONVERTER AND OPERATION METHOD THEREOF

CROSS-REFERENCE TO RELATED APPLICATION

This application claims priority to and the benefit of Korean Patent Application No. 10-2022-0019670, filed on Feb. 15, 2022, and Korean Patent Application No. 10-2022-0176611, filed Dec. 16, 2022, the disclosure of which is incorporated herein by reference in its entirety.

BACKGROUND OF THE INVENTION

1. Field of the Invention

The present disclosure relates to a continuous-time delta-sigma analog-to-digital converter, and more particularly to a technical idea of improving the performance of a continuous-time delta-sigma analog-to-digital converter by optimally designing an integrator and a quantizer.

2. Description of the Related Art

Continuous-time delta-sigma modulators (CTDSMs) provided with a $G_m$-C integrator and a VCO-based quantizer are being mainly used to implement high-resolution analog-to-digital converters (ADCs).

A continuous-time delta-sigma analog-to-digital converter converts an input voltage into a digital output code using an integrator and a VCO-based quantizer. Here, a digital output code is fed back to the input of an integrator to form a delta-sigma loop.

Specifically, a continuous-time delta-sigma analog-to-digital converter provides inherent $1^{st}$ order noise through a VCO-based quantizer and, since shaped quantization noise is suppressed by an integrator, may realize a high resolution in a signal band.

Such an existing continuous-time delta-sigma analog-to-digital converter uses a VCO-based quantizer, so there is an advantage for low-power operation, but there is a problem of a low input voltage compared to a supply voltage due to the linearity problem of each block.

Specifically, in the case of an existing continuous-time delta-sigma analog-to-digital converter, a large input voltage swing of an integrator due to quantization noise is exhibited and the linearity may be reduced even though a negative feedback loop is formed, and the non-linear KVCO of a VCO-based quantizer can greatly degrade the system linearity.

RELATED ART DOCUMENTS

Patent Documents

U.S. Pat. No. 9,397,692, "VOLTAGE-CONTROLLED OSCILLATOR (VCO) AS FIRST STAGE IN AN ANALOG-TO-DIGITAL CONVERTER (ADC) IN COMBINATION WITH A DIGITAL FILTER FOR SECOND OR HIGHER-ORDER NOISE SHAPING".

US Patent Application Publication No. 2007-0152865, "SIGNAL PROCESSING SYSTEM WITH ANALOG-TO-DIGITAL CONVERTER USING DELTA-SIGMA MODULATION HAVING AN INTERNAL STABILIZER LOOP".

Non-Patent Document

"28.4 A 400 mVpp 92.3 dB-SNDR 1 kHz-BW 2nd-Order-VCO-BasedExG-to-DigitalFront-EndUsingaMultiphase-Gated-InvertedRing-OscillatorQuantizer", C. Pochet, et al, ISSCC Dig. Tech. Papers, pp. 392-394, February 2021.

SUMMARY OF THE INVENTION

Therefore, the present disclosure has been made in view of the above problems, and it is an object of the present disclosure to provide a continuous-time delta-sigma analog-to-digital converter capable of maximizing the main performance, such as noise performance, linearity and a bandwidth, of the entire system by improving the noise-power efficiency and linearity of an integrator and a VCO-based quantizer; and an operation method of the continuous-time delta-sigma analog-to-digital converter.

It is another object of the present disclosure to provide a continuous-time delta-sigma analog-to-digital converter including an FIR filter provided on a delta-sigma feedback loop, thereby capable of preventing aliasing of quantization noise and boosting input impedance; and an operation method of the continuous-time delta-sigma analog-to-digital converter.

In accordance with an aspect of the present disclosure, the above and other objects can be accomplished by the provision of a continuous-time delta-sigma analog-to-digital converter, including: a linear integrator configured to generate a first output signal corresponding to a preset input voltage based on an operation of a linear Gm circuit that receives the preset input voltage; and a quantizer configured to generate a second output signal corresponding to the first output signal based on an operation of a body-driven VCO that receives the first output signal and to generate a digital output code corresponding to the second output signal based on an operation of a Frequency to Digital Converter (FDC) that receives the second output signal.

According to an aspect, the linear Gm circuit may include a plurality of operational amplifiers (OPAMP); and a plurality of resistors respectively connected to input terminals of the OPAMPs.

According to an aspect, the plural resistors may be respectively connected to the OPAMPs through one side end of each of the plural resistors and may be connected to a power supply voltage $V_{DD}$ line through another side end of each of the plural resistors.

According to an aspect, the OPAMPs may be current-recycling OPAMP.

According to an aspect, by the linear integrator, the input voltage may be copied to both ends of the plural resistors by a unit gain feedback in the linear Gm circuit to generate a linearly changing current, and the first output signal that corresponds to a change in the generated current may be generated.

According to an aspect, the linear integrator may further include a DC-current source connected to an output terminal of the linear Gm circuit.

According to an aspect, the body-driven VCO may include a plurality of inverter delay cells, wherein the first output signal is received through a body terminal of each of the plural inverter delay cells.

According to an aspect, each of the plural inverter delay cells may include a PMOS transistor connected to a power supply voltage line; and an NMOS transistor connected to the PMOS transistor and a ground line, wherein the first output signal is received through a body terminal of each of the PMOS transistor and the NMOS transistor.

According to an aspect, the continuous-time delta-sigma analog-to-digital converter may further include a 4-tap FIR filter provided on a delta-sigma feedback loop that connects an input terminal of the linear integrator and an output terminal of the quantizer.

In accordance with another aspect of the present disclosure, there is provided an operation method of a continuous-time delta-sigma analog-to-digital converter, the operation method including: by a linear integrator, generating a first output signal corresponding to a preset input voltage based on an operation of a linear Gm circuit that receives the preset input voltage; by a quantizer, generating a second output signal corresponding to the first output signal based on an operation of a body-driven VCO that receives the first output signal; and by the quantizer, generating a digital output code corresponding to the second output signal based on an operation of a Frequency to Digital Converter (FDC) that receives the second output signal.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE INVENTION

The embodiments will be described in detail herein with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do~" with other devices or components.

For example, in the sentence "processor configured to perform A, B, and C", the processor may refer to a general-purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the disclosure are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

Figure 1:
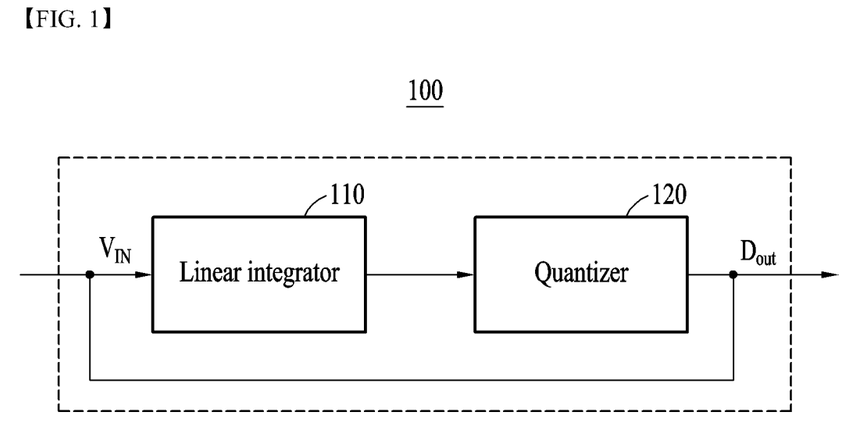
FIG. 1 is a diagram for explaining a continuous-time delta-sigma analog-to-digital converter according to an embodiment.

FIG. 1 is a diagram for explaining a continuous-time delta-sigma analog-to-digital converter according to an embodiment.

Referring to FIG. 1, the continuous-time delta-sigma analog-to-digital converter 100 according to an embodiment may optimize the main performances, such as noise performance, linearity and a bandwidth, of the entire system by improving the noise-power efficiency and linearity of an integrator and a VCO-based quantizer.

In addition, the continuous-time delta-sigma analog-to-digital converter 100 may include an FIR filter provided on a feedback loop to prevent aliasing of quantization noise and boost an input impedance.

For this, the continuous-time delta-sigma analog-to-digital converter 100 may include a linear integrator 110 and a quantizer 120 and may further include a 4-tap FIR filter provided on a delta-sigma feedback loop for connecting an input terminal of a linear integrator and an output terminal of a quantizer.

In addition, the continuous-time delta-sigma analog-to-digital converter 100 may further include a voltage generator that generates voltages (e.g., a power supply voltage $V_{DD}$, a bias voltage $V_{BIAS}$, an input voltage $V_{IN}$, etc.) described below and respectively supplies a corresponding voltage among the generated voltages to entities constituting a peripheral circuit connected to the continuous-time delta-sigma analog-to-digital converter 100 and the continuous-time delta-sigma analog-to-digital converter 100.

The linear integrator 110 according to an embodiment may generate a first output signal corresponding to a preset input voltage $V_{IN}$ based on the operation of a linear Gm circuit that receives the preset input voltage $V_{IN}$.

In addition, the quantizer 120 according to an embodiment may generate a second output signal corresponding to the first output signal based on the operation of a body-driven VCO that receives the first output signal and may generate a digital output code $D_{OUT}$ corresponding to the second output signal based on the operation of a Frequency to Digital Converter (FDC) that receives the second output signal.

Specifically, the continuous-time delta-sigma analog-to-digital converter 100 is a $1^{st}$ order CTDSM composed of the linear integrator 110 having low-noise characteristics and high linearity characteristics and the quantizer 120 based on a body-driven VCO and may achieve low quantization noise characteristics within a signal bandwidth due to inherent noise characteristics of the VCO-based quantizer while having high stability due to the characteristics of a $1^{st}$ order loop.

The continuous-time delta-sigma analog-to-digital converter 100 according to an embodiment is described in more detail below with reference to FIG. 2.

Figure 2:
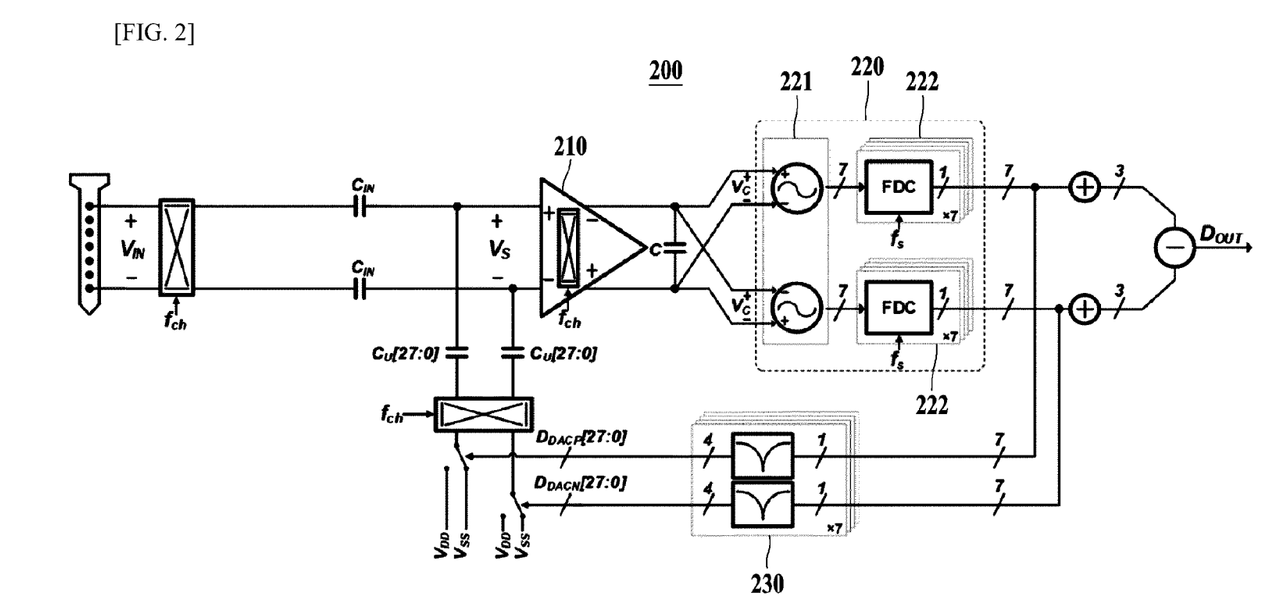
FIG. 2 is a diagram for more specifically explaining a continuous-time delta-sigma analog-to-digital converter according to an embodiment.

FIG. 2 is a diagram for more specifically explaining a continuous-time delta-sigma analog-to-digital converter according to an embodiment.

Referring to FIG. 2, a continuous-time delta-sigma analog-to-digital converter 200 according to an embodiment may include a linear integrator 210 and a quantizer 220. Here, the quantizer 220 may further include a body-driven VCO 221 connected to the linear integrator 210; and FDC 222 connected to the body-driven VCO 221.

The linear integrator 210 according to an embodiment may generate a first output signal corresponding to a preset input voltage $V_{IN}$ based on the operation of a linear Gm circuit that receives the preset input voltage $V_{IN}$.

According to an aspect, the linear Gm circuit may include a plurality of operational amplifiers (OPAMPs) and a plurality of resistors respectively connected to input terminals of the OPAMPs. Here, the OPAMPs may be current-recycling OPAMPs.

For example, the plural resistors may be respectively connected to the OPAMPs through one side end of each of the resistors and may be connected to a power supply voltage $V_{DD}$ line through another side end of each of the resistors.

In addition, the linear integrator 210 may further include a DC-current source that is connected to an output terminal of a linear Gm circuit.

According to an aspect, the linear integrator 210 may generate a current that linearly changes by copying (i.e. imitating) the input voltage to both ends of the plural resistors by a unit gain feedback in the linear Gm circuit and may generate a first output signal corresponding to a change in the generated current.

The body-driven VCO 221 according to an embodiment may receive the first output signal and may generate a second output signal corresponding to the first output signal.

According to an aspect, the body-driven VCO 221 may include a plurality of inverter delay cells and may receive the first output signal through a body terminal of each of the plural inverter delay cells.

Specifically, each of the plural inverter delay cells may include a PMOS transistor connected to a power supply voltage line; and an NMOS transistor connected to the PMOS transistor and a ground line and may receive the first output signal through a body terminal of each of the PMOS transistor and the NMOS transistor.

The FDC according to an embodiment may receive the second output signal and may generate a digital output code $D_{OUT}$ corresponding to the second output signal.

According to an aspect, an analog-to-digital converter 200 may further include a chopper switch provided in an input terminal of the linear integrator 210.

Meanwhile, the analog-to-digital converter 200 may further include a 4-tap FIR filter 230 provided on a delta-sigma feedback loop that connects an input terminal of the linear integrator 210 and an output terminal of the FDC 222 to boost an input impedance.

Specifically, the input impedance of the analog-to-digital converter 200 is determined by a chopping frequency $f_{CH}$ at an input capacitor $C_{IN}$ provided between an input terminal of the linear integrator 210 and a ground line and a node connected to the input terminal of the linear integrator 210 and, in the case of conventional devices, a chopping frequency is equal to fs, where fs is a sampling frequency, or used as fs/2 to prevent aliasing of quantization noise due to chopping.

However, in this case, there is a problem of having a low input impedance of 1 MΩ or less due to a high sampling frequency. To solve this problem, the analog-to-digital converter 200 may generate notches in quantization noise by connecting a 4-tap FIR filter onto a feedback loop.

Specifically, the analog-to-digital converter 200 filters the quantization noise of a frequency band in which aliasing occurs through the 4-tap FIR filter 230 to prevent the aliasing of quantization noise caused by chopping.

In addition, the analog-to-digital converter 200 uses a notch frequency of fs/8 generated through the 4-tap FIR filter 230 as a chopping frequency, thereby increasing the input impedance by 4 times compared to an existing device.

Figure 3:
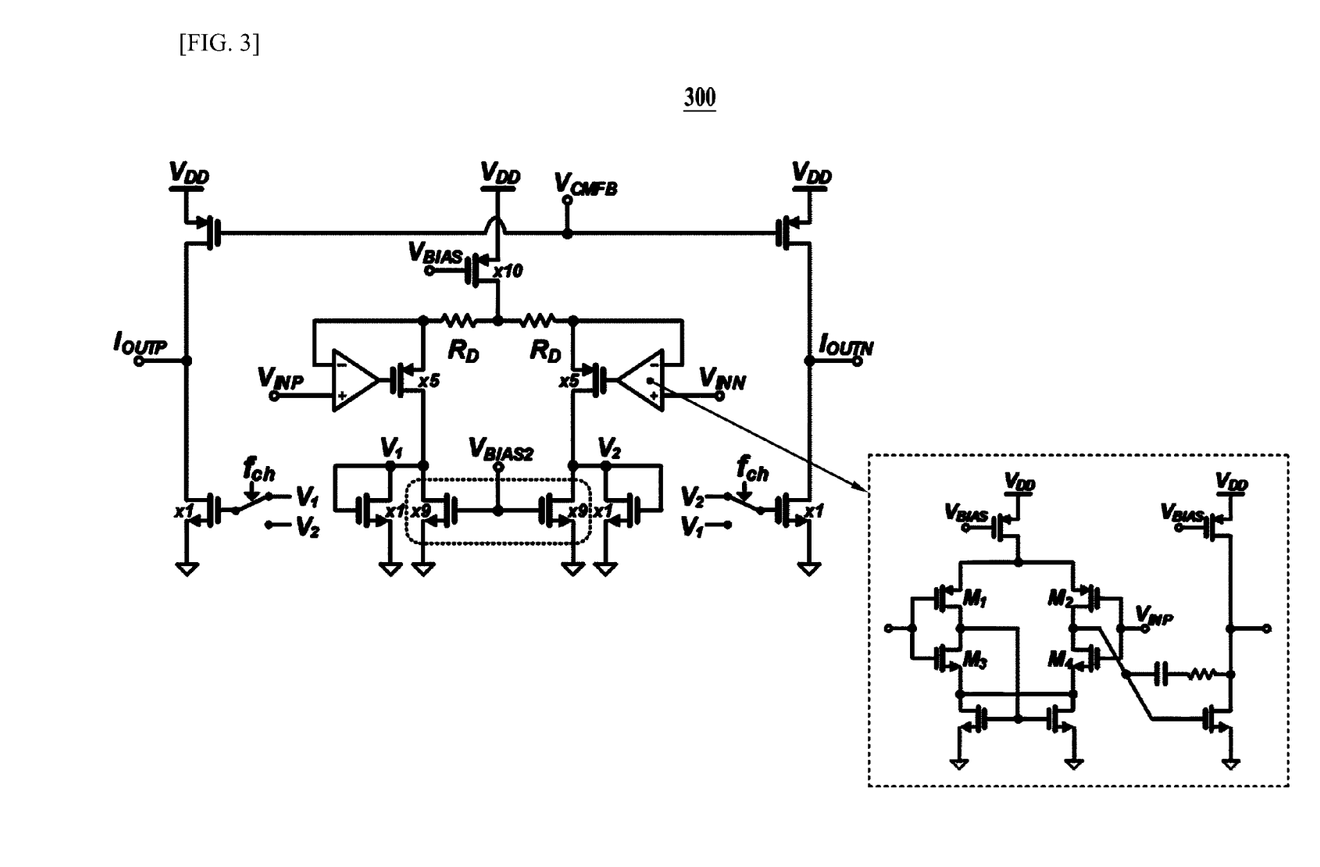
FIG. 3 is a diagram for more specifically explaining a linear integrator according to an embodiment.

FIG. 3 is a diagram for more specifically explaining a linear integrator according to an embodiment.

Referring to FIG. 3, a linear integrator 300 according to an embodiment is a first entity to which the input of an analog-to-digital converter is applied and plays a major role in determining system noise and linearity, so it may be designed to have low noise and high linearity.

The linear integrator 300 according to an embodiment may generate first output signals $I_{OUTN}$, $I_{OUTP}$ corresponding to input voltages $V_{INN}$, $V_{INP}$ based on the operation of a linear Gm circuit 310 receiving preset input voltages $V_{INN}$, $V_{INP}$.

The linear Gm circuit 310 may include a plurality of operational amplifiers 311 and a plurality of resistors $R_D$ connected to an input terminal of each of the OPAMPs 311, and the plural resistors $R_D$ may be respectively connected to the OPAMPs 311 through one side end of each of the plural resistors $R_D$ and may be respectively connected to a power supply voltage $V_{DD}$ line through another side end of each of the plural resistors $R_D$.

In addition, the linear integrator 300 may further include a DC-current source 320 connected to an output terminal of the linear Gm circuit 310.

Meanwhile, in the linear integrator 300, each of the OPAMPs 311 may be designed as current-recycling OPAMP to improve noise power efficiency.

The input voltage $V_{INP}$ may be received through gate terminals of transistors M2 and M4 among a plurality of transistors constituting the OPAMPs 311, and the input voltage $V_{INN}$ may be received through gate terminals of transistors M1 and M3 among the transistors. Here, the transistors M1 to M4 may operate as a transconductance amplifier based on the input voltages $V_{INN}$ and $V_{INP}$.

According to an aspect, the linear integrator 300 may generate a linearly changing current by copying the input voltages $V_{INN}$, $V_{INP}$ to both ends of the plural resistors RD by a unit gain feedback in the linear Gm circuit 310 and may generate a first output signal corresponding to a change in the generated current.

Specifically, the linear integrator 300 may generate output currents $I_{OUTN}$, $I_{OUTP}$ by copying the linear current change generated by the linear Gm circuit 310 to an output terminal by the NMOS transistor, and, since the generated output currents $I_{OUTN}$, $I_{OUTP}$ flow into a load capacitor of the linear integrator 300, linearity may be maintained. Here, the output currents $I_{OUTN}$, $I_{OUTP}$ may be converted to corresponding voltages (i.e., first output signals) by the load capacitor.

FIGS. 4A to 4D are diagrams for more specifically explaining a linear Gm circuit according to an embodiment.

Referring to FIGS. 4A to 4D, Reference numeral 410 illustrates an existing transconductance circuit $G_m$-cell, and Reference numeral 420 illustrates linearity characteristics of the existing transconductance circuit.

In addition, Reference numeral 430 illustrates a linear Gm circuit, linear $G_m$-cell, according to an embodiment, and Reference numeral 440 illustrates linearity characteristics of the linear Gm circuit according to an embodiment.

Figure 4A:
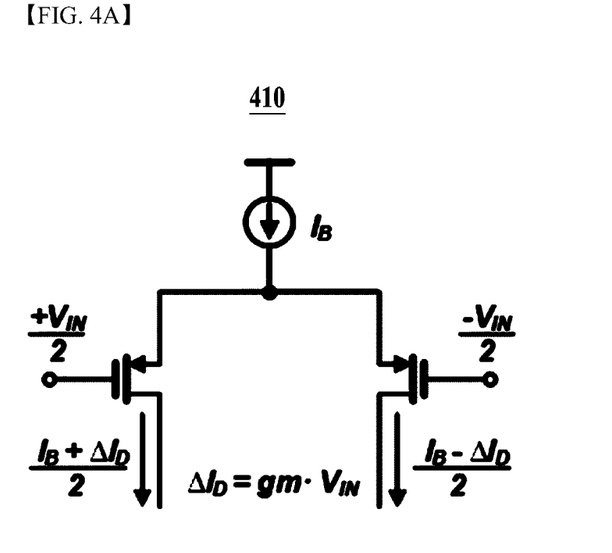
FIGS. 4A to 4D are diagrams for more specifically explaining a linear Gm circuit according to an embodiment.
Figure 4B:
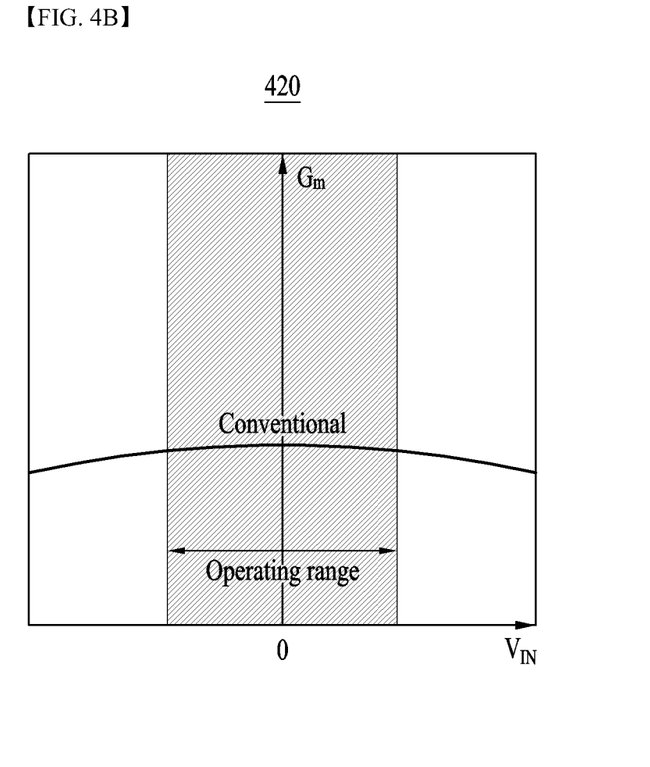

According to Reference numeral 410 and 420, an input transistor of the existing transconductance circuit is a transconductance amplifier and generates a current having a specific gain $G_m$ when an input voltage is applied thereto. In a differential structure, $G_m$ is defined as in Equation 1 below and represents a nonlinear characteristic.

$$\frac{\partial \Delta I_D}{\partial \Delta V_{in}} = \frac{1}{2}\mu_n C_{ox} \frac{W}{L} \frac{\frac{4I_{SS}}{\mu_n C_{ox} W/L} - 2\Delta V_{in}^2}{\sqrt{\frac{4I_{SS}}{\mu_n C_{ox} W/L} - \Delta V_{in}^2}} \quad \text{[Equation 1]}$$

Figure 4C:
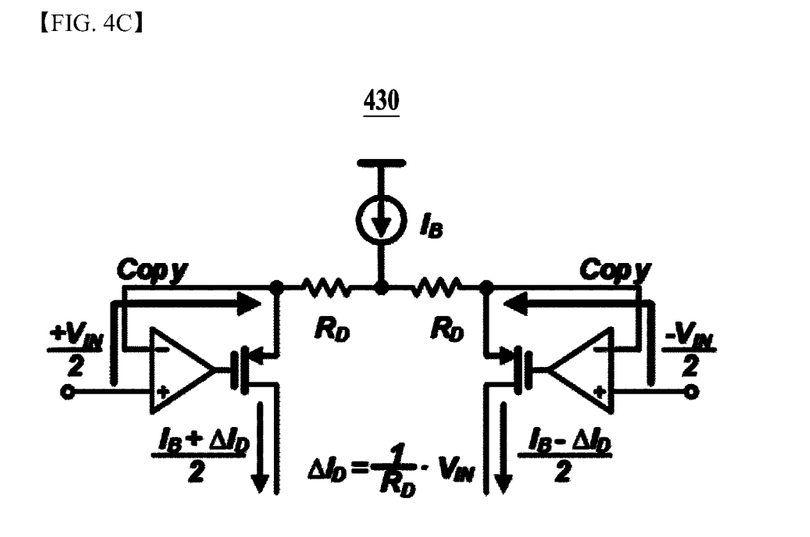
Figure 4D:
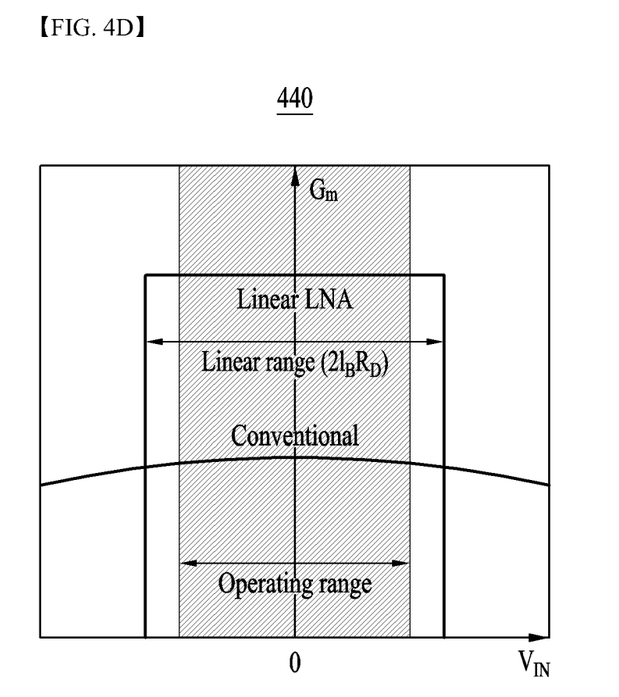

On the other hand, according to Reference numeral 430 and 440, the linear Gm circuit according to an embodiment does not depend only on the $G_m$ characteristics of the input transistor, unlike the existing transconductance circuit, the input voltage is copied to both ends of the resistor $R_D$ by a unit gain feedback, and a change $\Delta R_D$ in the copied input voltage may generate a linearly changing current $\Delta I_D$ as shown in Equation 2 below in the characteristic of the resistor.

$$\Delta I_D = \frac{\Delta V_{IN}}{R_D} \quad \text{[Equation 2]}$$

Here, when the input voltage $V_{IN}$ is $V_{INN}$, $V_{INP}$, a linearly changing current $I_D$ may be expressed as $(V_{INP}-V_{INN})/(2\times R_D)$.

Therefore, the change in current according to the input voltage is defined as $1/R_D$ and, accordingly, the linear Gm circuit according to an embodiment may implement linear characteristics.

Figure 5A:
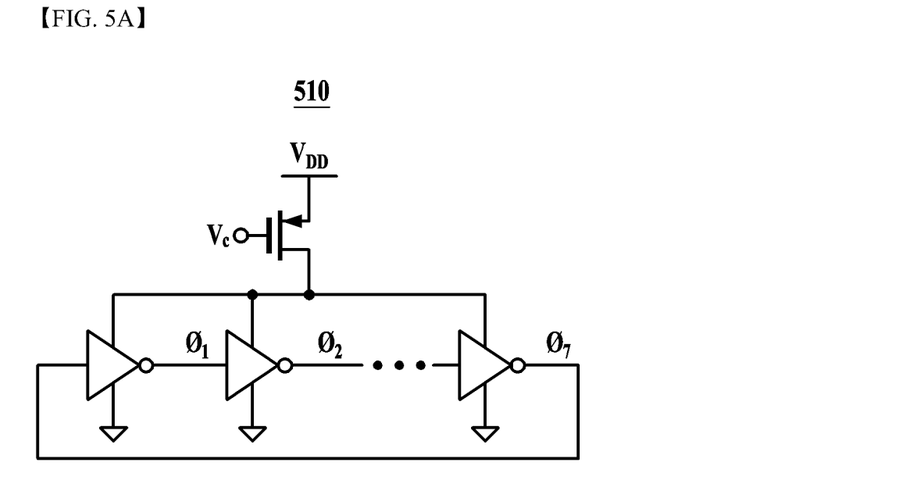
FIGS. 5A and 5B are diagrams for more specifically explaining a body-driven VCO according to an embodiment.
Figure 5B:
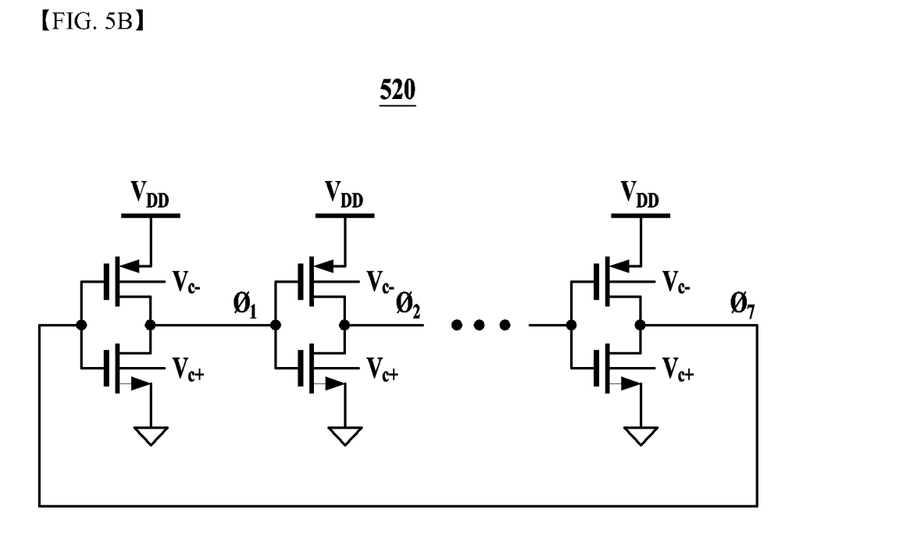

FIGS. 5A and 5B are diagrams for more specifically explaining a body-driven VCO according to an embodiment.

Referring to FIGS. 5A and 5B, Reference numeral 510 illustrates an existing gate-driven VCO, and Reference numeral 520 illustrates a body-driven VCO.

Specifically, the quantizer included in the continuous-time delta-sigma analog-to-digital converter according to an embodiment may generate a second output signal corresponding to the first output signal based on the operation of the body-driven VCO that receives the first output signal output from the linear integrator and may generate a digital output code $D_{OUT}$ corresponding to the second output signal based on the operation of FDC that receives the second output signal.

Specifically, in the case of the conventional gate-driven VCO according to Reference numeral 510, a change in output frequency is caused by a change in delay of each inverter delay-cell, and this delay change is generated by a change in the current of the PMOS transistor.

Here, the input voltage VC of the gate-driven VCO is applied to a gate terminal of the PMOS transistor, and the Gm characteristic of the PMOS transistor greatly affects the linearity That is, since the Gm of a PMOS transistor has a nonlinear characteristic, a change in output frequency with respect to the input voltage of the gate-driven VCO has a nonlinear characteristic.

On the other hand, in the case of body-driven VCO according to an embodiment of Reference numeral 520, input voltages $V_{C+}$, $V_{C-}$ are applied to a body terminal of the inverter delay-cell, unlike the existing gate-driven VCO, whereby the change in the delay of the inverter delay-cell is caused by a change in a threshold voltage of each of the PMOS transistor and NMOS transistor constituting the inverter delay-cell due to a change in the body voltage.

That is, a change in output frequency versus input voltage of the body-driven VCO according to an embodiment is caused by the $G_{mb}$ characteristic of each transistor, and since $G_{mb}$ has linear characteristics compared to $G_m$, the body-driven VCO according to an embodiment may secure linear characteristics than the existing gate-driven VCO.

Figure 6A:
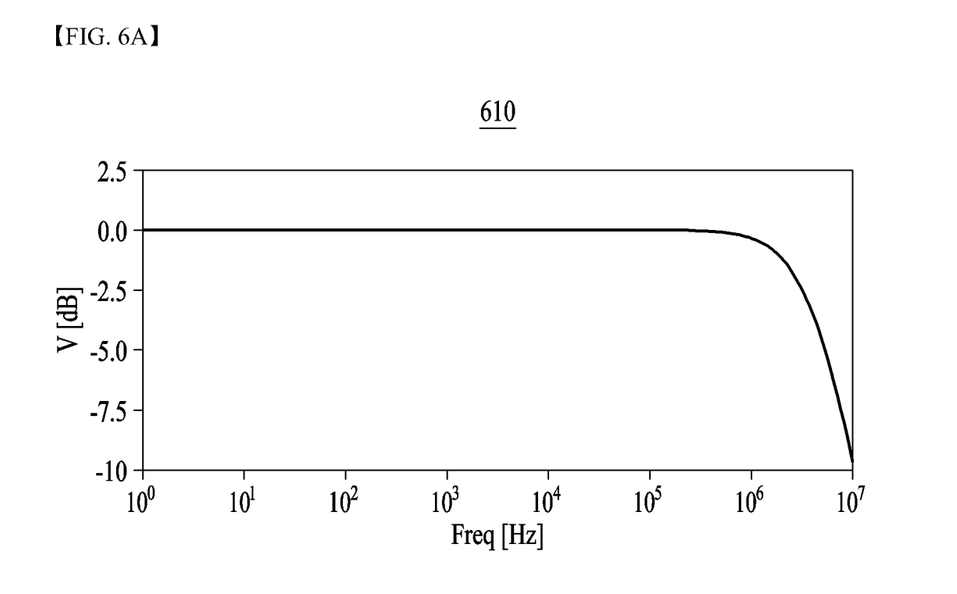
FIGS. 6A and 6B are diagrams for explaining the performance simulation results of a linear integrator according to an embodiment.
Figure 6B:
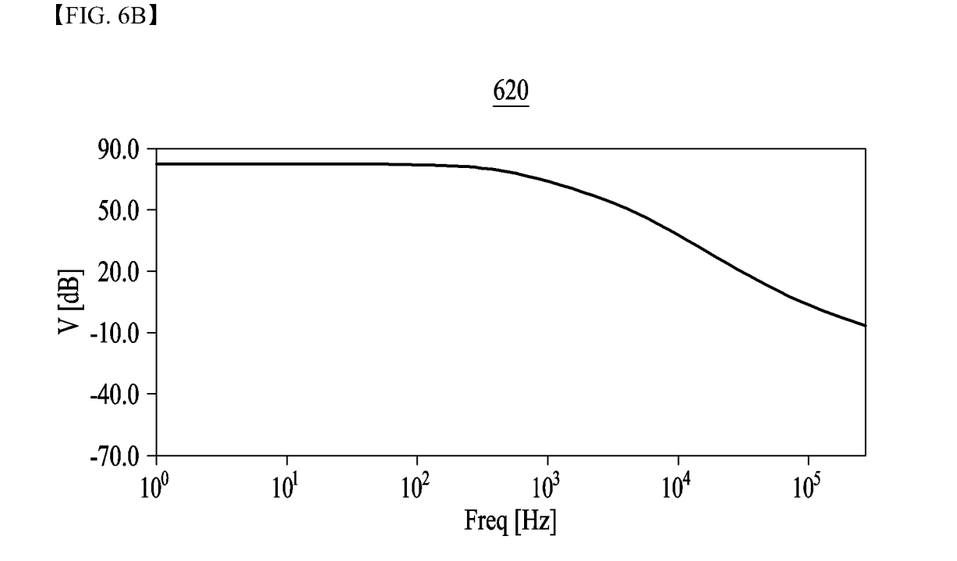

FIGS. 6A and 6B are diagrams for explaining the performance simulation results of a linear integrator according to an embodiment.

Reference numeral 610 illustrates a frequency response characteristic wherein an input voltage is copied to both ends of the resistor $R_D$ in the linear Gm circuit provided in the linear integrator according to an embodiment, and Reference numeral 620 illustrates a frequency response characteristic of an output voltage versus an input voltage of the linear integrator according to an embodiment.

In the case of the linear Gm circuit according to an embodiment of Reference numeral 610, it can be confirmed that the input voltage is well copied to both ends of the resistor. In other words, it can be confirmed that, in the case of the linear Gm circuit, the input voltage is accurately copied within a bandwidth where a loop gain of the unit gain feedback is well maintained.

In the case of the linear integrator according to an embodiment of Reference numeral 620, it can be confirmed that a 3 dB-corner frequency appears in a bandwidth of about 200 Hz by the load capacitor.

Figure 7A:
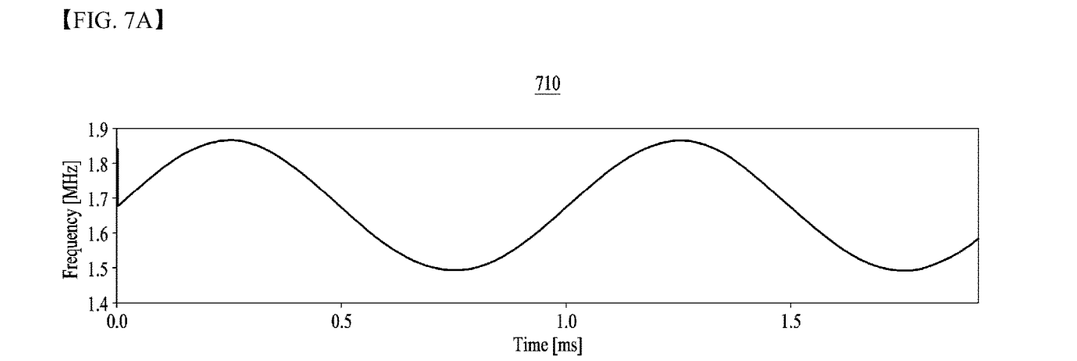
FIGS. 7A and 7B are diagrams for explaining the performance simulation results of a body-driven VCO according to an embodiment.
Figure 7B:
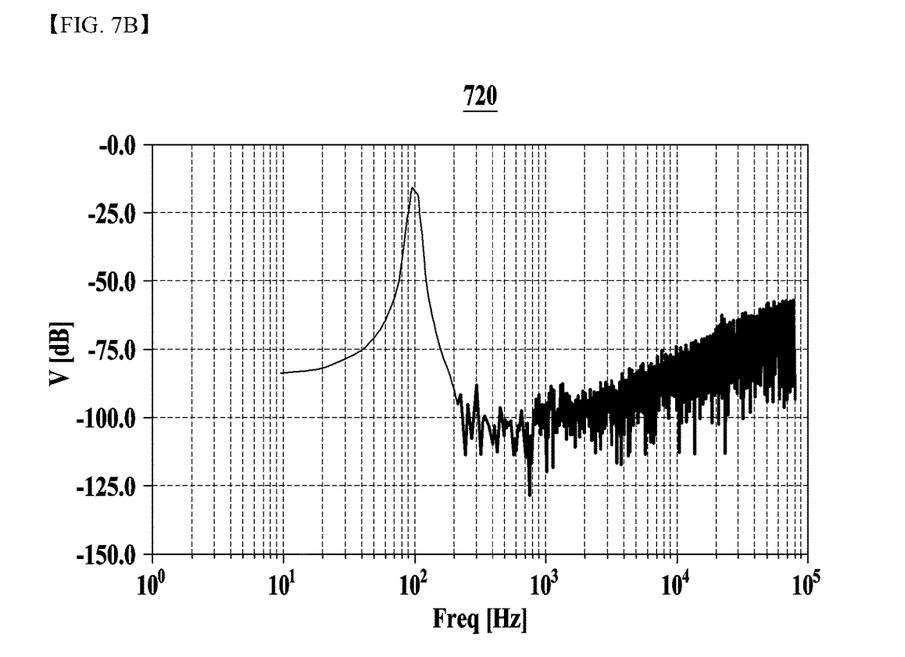

FIGS. 7A and 7B are diagrams for explaining the performance simulation results of a body-driven VCO according to an embodiment.

According to FIGS. 7A and 7B, Reference numeral 710 illustrates a simulation result of a frequency change of an oscillator according to single tone input, and Reference numeral 720 illustrates a simulation result of a power spectrum density (PSD) of a quantizer using a body-driven VCO according to an embodiment.

According to Reference numeral 710 and 720, the conventional nonlinear oscillator generates a harmonic for single tone input and, as can be seen in Reference numeral 720, the body-driven VCO according to an embodiment has about 72 dB less harmonic compared to the single tone, which represents an improvement of about 20 dB compared to the conventional gate-driven oscillator.

Figure 8A:
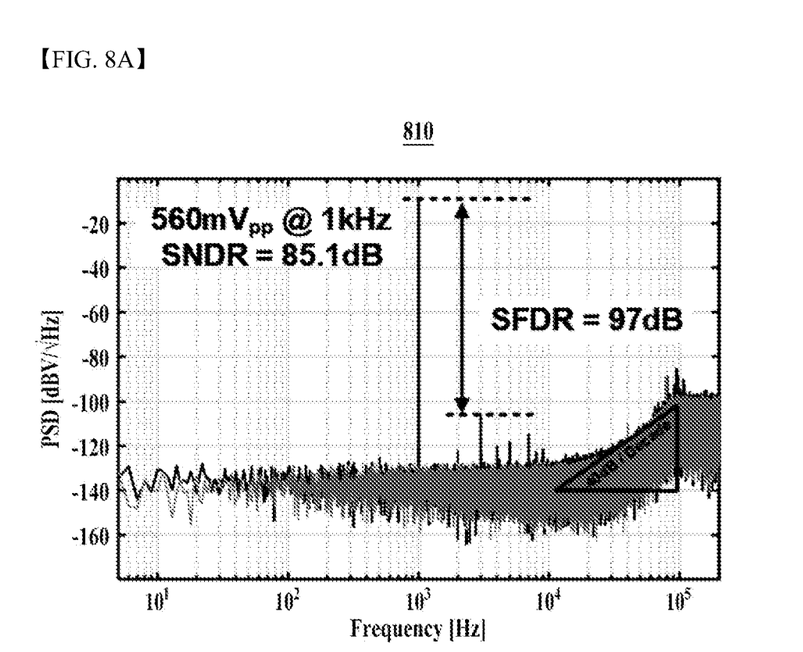
FIGS. 8A to 8C are diagrams for explaining the performance simulation results of a continuous-time delta-sigma analog-to-digital converter according to an embodiment.
Figure 8B:
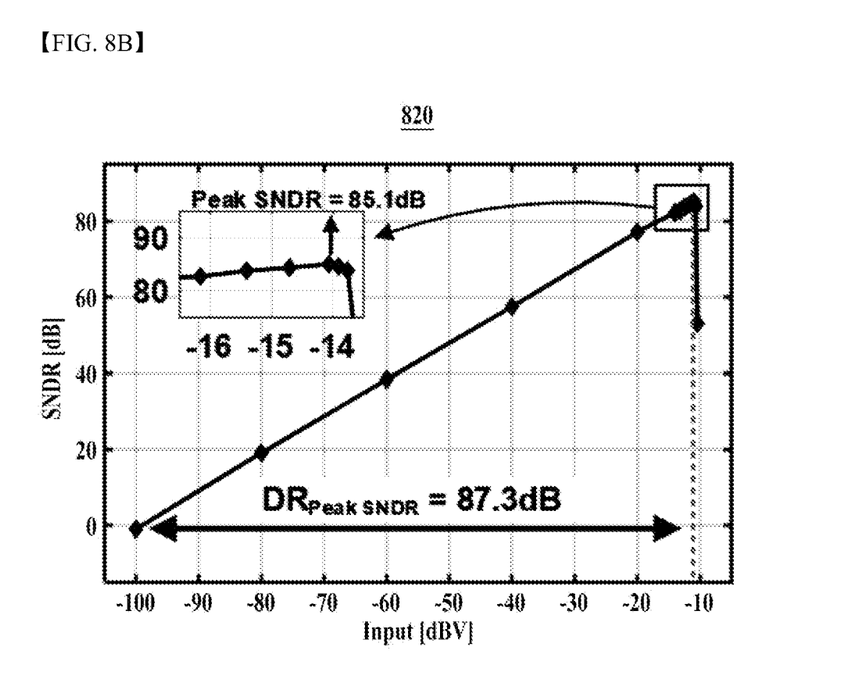
Figure 8C:
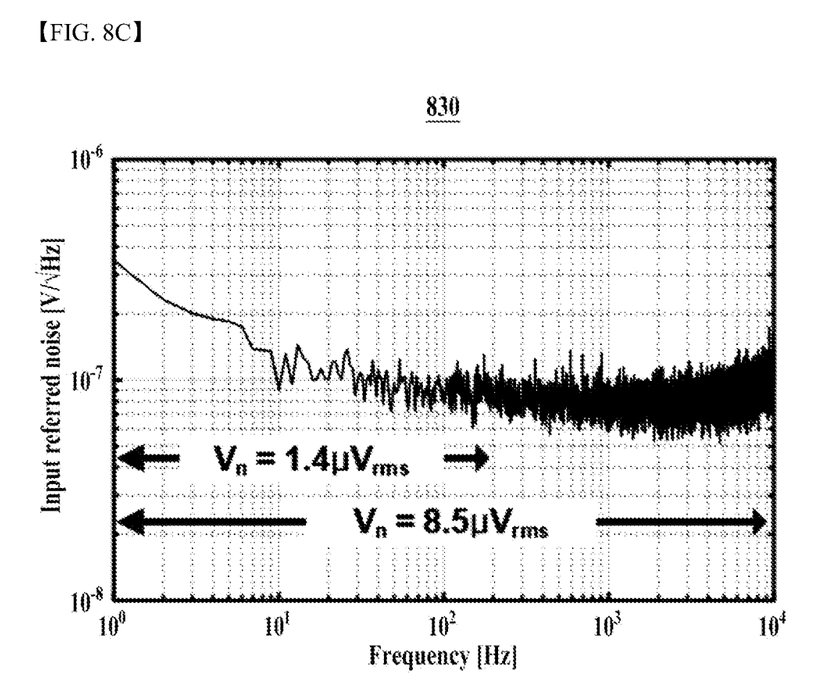

FIGS. 8A to 8C are diagrams for explaining the performance simulation results of a continuous-time delta-sigma analog-to-digital converter according to an embodiment.

Referring to FIGS. 8A to 8C, Reference numeral 810 illustrates a simulation result of a power spectrum density (PSD) of the continuous-time delta-sigma analog-to-digital converter according to an embodiment, Reference numeral 820 illustrates a simulation result of a Signal-to-Noise plus Distortion Ratio (SNDR) of the continuous-time delta-sigma analog-to-digital converter according to an embodiment, and Reference numeral 830 illustrates a noise simulation result of the continuous-time delta-sigma analog-to-digital converter according to an embodiment.

According to Reference numerals 810 to 830, in the case of the continuous-time delta-sigma analog-to-digital converter according to an embodiment, SNDR of 85.1 dB and SFDR of 97 dB were measured in 10 kHz bandwidth when an input of 560 mVpp was applied at 0.7 V supply voltage. From the SNDR measurement result, it was confirmed that the peak SNDR of 85.1 dB corresponds to DR of 87.3 dB.

In addition, as a confirmation result of the noise performance of the continuous-time delta-sigma analog-to-digital converter according to an embodiment, a noise performance of 1.4 µVrms at 200 Hz and a noise performance of 8.5 µVrms at 10 kHz were measured.

Meanwhile, as shown in Table 1 below in which the main performance of the continuous-time delta-sigma analog-to-digital converter according to an embodiment (this work) and the main performances of systems (ISSCC'18, ISSCC'19 and ISSCC'21) based on a known CTDSM structure are compared, the continuous-time delta-sigma analog-to-digital converter according to an embodiment achieved performances of 85.1 dB SNDR, 178.1 dB $FOM_{SNDR}$, and 17 fJ/step $FOM_W$, showing the highest performance compared to the existing systems.

TABLE 1

| Parameter | ISSCC'18 | ISSCC'20 | ISSCC'21 | ISSCC'21 | This work |
|---|---|---|---|---|---|
| Technology [nm CMOS] | 40 | 180 | 65 | 65 | 180 |
| Topology | CCIA + CTΔΣM | CTΔΣM | CTΔΣM | DPCM | CTΔΣM |
| Supply Voltage [V] | 1.2 | 1 | 1.2 (A)/0.8 (D) | 0.8 | 0.7 |
| Power/Ch [µW] | 7.3 | 6.5 | 5.8 | 1.68 | 5 |
| BW [Hz] | 1-200   1-5k | 1-10k | 1k | 500 | 1-200   1-10k |
| Inp.- Ref. Noise [µV$_{rms}$] | 1.8     6.35 | 9.2 | 3.56 | 2.63 | 1.4     8.5 |
| Peak SNDR [dB] | 78 | 80.4 | 92.3 | 94.2 | 85.1 |
| $DR_{Peak\_SNDR}$ [dB] | 81 | 81 | 92.3 | 95.1 | 87.3 |
| SFDR [ dB] | 82 | 92.2 | 110.3 | 128 | 97 |
| $FOM_{SNDR}/FOM_{DR}$ [dB] | 166.4/169.4 | 172.3/172.9 | 174.7/174.7 | 178.9/179.8 | 178.1/180.3 |
| $FOM_W$ [fJ/step] | 112.4 | 38 | 63 | 40 | 17 |
| Peak Input [mVpp] | 200 | 300 | 400 | 460 | 560 |
| $Z_{IN}$ @DC [MΩ] | 1500[1] @ $f_{ch}$ = 23.44 kHz | ∞ @ w/o chopping | 60[1] @ $f_{ch}$ = 100 kHz | 8 @ $f_{ch}$ = 32 kHz | >421[1] @ $f_{ch}$ = 320 kHz |
| $Z_{IN}$ @1 kHz [MΩ] | 98[1] @ $f_{ch}$ = 23.44 kHz | 130 @ w/o chopping | 50[1] @ $f_{ch}$ = 100 kHz | 8 @ $f_{ch}$ = 32 kHz | >147[1] @ $f_{ch}$ = 320 kHz |
| CMRR [dB] | >78 | 76 | 89 | 97 | >82 |
| Channel Area [mm$^2$] | 0.113 | 0.078 | 0.075 | 0.055 | 0.108 |

Figure 9:
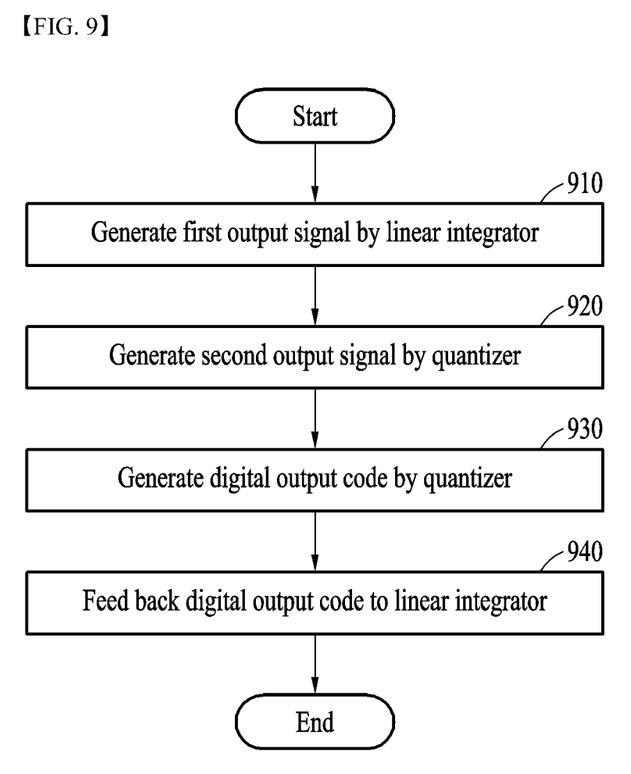
FIG. 9 is a diagram for explaining an operation method of a continuous-time delta-sigma analog-to-digital converter according to an embodiment.

FIG. 9 is a diagram for explaining an operation method of a continuous-time delta-sigma analog-to-digital converter according to an embodiment.

In other words, FIG. 9 is a drawing illustrating an operation method of the continuous-time delta-sigma analog-to-digital converter according to an embodiment that has been described with reference to FIGS. 1 to 8C. In describing with reference to FIG. 9, descriptions overlapping the contents that have been with reference to FIGS. 1 to 8C are omitted.

Referring to FIG. 9, in step 910 of the operation method, a first output signal corresponding to an input voltage may be generated by a linear integrator based on an operation of a linear Gm circuit that receives a preset input voltage.

For example, the linear Gm circuit may include a plurality of operational amplifiers (OPAMPs) and a plurality of resistors respectively connected to input terminals of OPAMPs.

In addition, the plural resistors may be respectively connected to the OPAMPs through one side end of each of the resistors and may be connected to a power supply voltage $V_{DD}$ line through another side end of each of the resistors.

In addition, the OPAMPs may be current-recycling OPAMPs.

In addition, the linear integrator may further include a DC-current source connected to an output terminal of the linear Gm circuit.

According to an aspect, in the linear integrator of step 910 of the operation method, a linearly changing current may be generated by copying (i.e. imitating) the input voltage to both ends of the plural resistors by a unit gain feedback in the linear Gm circuit and may generate a first output signal corresponding to a change in the generated current.

Next, in a quantizer of step 920 of the operation method, a second output signal corresponding to the first output signal may be generated based on an operation of a body-driven VCO that receives the first output signal.

For example, the body-driven VCO may include a plurality of inverter delay cells and may receive the first output signal through a body terminal of each of the plural inverter delay cells.

Specifically, each of the plural inverter delay cells may include a PMOS transistor connected to a power supply voltage line; and an NMOS transistor connected to the PMOS transistor and a ground line and may receive the first output signal through a body terminal of each of the PMOS transistor and the NMOS transistor.

Next, in the quantizer of step 930 of the operation method, a digital output code corresponding to the second output signal may be generated based on an operation of a Frequency to Digital Converter (FDC) that receives the second output signal.

Meanwhile, in step 940 of the operation method, a digital output code may be fed back to an input of the linear integrator through a delta-sigma feedback loop that connects an input terminal of the linear integrator and an output terminal of the quantizer. Here, a 4-tap FIR filter may be provided on the delta-sigma feedback loop.

In the 4-tap FIR filter of step 940 of the operation method, a chopping frequency of the continuous-time delta-sigma analog-to-digital converter according to an embodiment may be controlled based on the digital output code.

In conclusion, the noise-power efficiency and linearity of an integrator and a VCO-based quantizer may be improved by using the present disclosure so that the main performances, such as noise performance, linearity and a bandwidth, of the entire system can be maximized.

In addition, the aliasing of quantization noise can be prevented and input impedance can be boosted by providing an FIR filter on a feedback loop according to the present disclosure.

According to an embodiment, the present disclosure can maximize the main performance, such as noise performance, linearity and a bandwidth, of the entire system by improving the noise-power efficiency and linearity of an integrator and a VCO-based quantizer.

According to an embodiment, the present disclosure includes an FIR filter provided on a delta-sigma feedback loop, thereby being capable of preventing aliasing of quantization noise and boosting input impedance.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

[Description of Symbols]

100: continuous-time delta-sigma analog-to-digital converter
110: linear integrator
120: quantizer

What is claimed is:

1. A continuous-time delta-sigma analog-to-digital converter, comprising:
    a linear integrator configured to generate a first output signal corresponding to a preset input voltage based on an operation of a linear Gm circuit that receives the preset input voltage; and
    a quantizer configured to generate a second output signal corresponding to the first output signal based on an operation of a body-driven VCO that receives the first output signal and to generate a digital output code corresponding to the second output signal based on an operation of a Frequency to Digital Converter (FDC) that receives the second output signal,
    wherein the continuous-time delta-sigma analog-to-digital converter operates based on an input impedance determined by chopping frequency ($f_{CH}$) at a node connected to an input terminal of the linear integrator and an input capacitor ($C_{IN}$) provided between the input terminal of the linear integrator and a ground line.

2. The continuous-time delta-sigma analog-to-digital converter according to claim 1, wherein the linear Gm circuit comprises a plurality of operational amplifiers (OPAMP); and a plurality of resistors respectively connected to input terminals of the OPAMPs.

3. The continuous-time delta-sigma analog-to-digital converter according to claim 2, wherein the plural resistors are respectively connected to the OPAMPs through one side end of each of the plural resistors and are connected to a power supply voltage VDD line through another side end of each of the plural resistors.

4. The continuous-time delta-sigma analog-to-digital converter according to claim 2, wherein the OPAMPs are current-recycling OPAMP.

5. The continuous-time delta-sigma analog-to-digital converter according to claim 2, wherein, by the linear integrator, the input voltage is copied to both ends of the plural resistors by a unit gain feedback in the linear Gm circuit to generate a linearly changing current, and the first output signal that corresponds to a change in the generated current is generated.

6. The continuous-time delta-sigma analog-to-digital converter according to claim 1, wherein the linear integrator further comprises a DC-current source connected to an output terminal of the linear Gm circuit.

7. The continuous-time delta-sigma analog-to-digital converter according to claim 1, wherein the body-driven VCO comprises a plurality of inverter delay cells,
    wherein the first output signal is received through a body terminal of each of the plural inverter delay cells.

8. The continuous-time delta-sigma analog-to-digital converter according to claim 7, wherein each of the plural inverter delay cells comprises a PMOS transistor connected to a power supply voltage line; and an NMOS transistor connected to the PMOS transistor and a ground line, wherein the first output signal is received through a body terminal of each of the PMOS transistor and the NMOS transistor.

9. The continuous-time delta-sigma analog-to-digital converter according to claim 1, further comprising a 4-tap FIR filter provided on a delta-sigma feedback loop that connects an input terminal of the linear integrator and an output terminal of the quantizer.

10. An operation method of a continuous-time delta-sigma analog-to-digital converter, the operation method comprising:
- by a linear integrator, generating a first output signal corresponding to a preset input voltage based on an operation of a linear Gm circuit that receives the preset input voltage;
- by a quantizer, generating a second output signal corresponding to the first output signal based on an operation of a body-driven VCO that receives the first output signal; and
- by the quantizer, generating a digital output code corresponding to the second output signal based on an operation of a Frequency to Digital Converter (FDC) that receives the second output signal,
- wherein the operation method of the continuous-time delta-sigma analog-to-digital converter operates based on an input impedance determined by chopping frequency (fCH) at a node connected to an input terminal of the linear integrator and an input capacitor (CIN) provided between the input terminal of the linear integrator and a ground line.

* * * * *